United States Patent
Kim et al.

(10) Patent No.: US 7,148,100 B2
(45) Date of Patent: Dec. 12, 2006

(54) METHODS OF FORMING ELECTRONIC DEVICES INCLUDING HIGH-K DIELECTRIC LAYERS AND ELECTRODE BARRIER LAYERS

(75) Inventors: Byung-Hee Kim, Seoul (KR); Gil-Heyun Choi, Gyeonggi-do (KR); Kyung-In Choi, Gyeonggi-do (KR); Chang-Won Lee, Seoul (KR)

(73) Assignee: Samsung Electronics Co., Ltd, Kyungki-Do (KR)

( * ) Notice: Subject to any disclaimer, the term of this patent is extended or adjusted under 35 U.S.C. 154(b) by 0 days.

(21) Appl. No.: 10/969,564

(22) Filed: Oct. 20, 2004

(65) Prior Publication Data

US 2005/0082625 A1  Apr. 21, 2005

Related U.S. Application Data

(62) Division of application No. 10/411,949, filed on Apr. 11, 2003, now abandoned.

(30) Foreign Application Priority Data

Apr. 11, 2002 (KR) .......................... 2002-0019674

(51) Int. Cl.
*H01L 21/8238* (2006.01)
(52) U.S. Cl. ................ 438/218; 438/267; 257/E21.639
(58) Field of Classification Search ................ 438/287, 438/591, 267, 218; 257/E21.639
See application file for complete search history.

(56) References Cited

U.S. PATENT DOCUMENTS

| | | | |
|---|---|---|---|
| 6,049,114 A | | 4/2000 | Maiti et al. |
| 6,255,698 B1 * | | 7/2001 | Gardner et al. ............. 257/369 |
| 6,291,282 B1 | | 9/2001 | Wilk et al. |
| 6,368,923 B1 | | 4/2002 | Huang |
| 6,410,376 B1 | | 6/2002 | Ng et al. |
| 6,492,217 B1 * | | 12/2002 | Bai et al. ..................... 438/199 |
| 6,504,214 B1 | | 1/2003 | Yu et al. |
| 6,562,491 B1 | | 5/2003 | Jeon |
| 6,569,783 B1 * | | 5/2003 | Uzoh et al. ................. 438/785 |
| 6,660,598 B1 * | | 12/2003 | Hanafi et al. ............... 438/291 |

(Continued)

FOREIGN PATENT DOCUMENTS

KR  10-2000-0035691  6/2000

(Continued)

OTHER PUBLICATIONS

Rogers, B.R., Underlayer work function effect on nucleation and film morphology of chemical vapor deposited aluminum, *Thin Solid Films*, 408 (Mar. 2002) 87.*

(Continued)

*Primary Examiner*—Bradley K. Smith
(74) *Attorney, Agent, or Firm*—Myers Bigel Sibley & Sajovec

(57) ABSTRACT

Methods of forming a microelectronic device can include providing a gate dielectric layer on a channel region of a semiconductor substrate wherein the gate dielectric layer is a high-k dielectric material. A gate electrode barrier layer can be provided on the gate dielectric layer opposite the channel region of the semiconductor substrate, and a gate electrode metal layer can be provided on the gate electrode barrier layer opposite the channel region of the semiconductor substrate. The gate electrode barrier layer and the gate electrode metal layer can be formed of different materials. Moreover, the gate electrode metal layer can include a first material and the gate electrode barrier layer can include a second material, and the first material can have a lower electrical resistivity than the second material.

7 Claims, 6 Drawing Sheets

U.S. PATENT DOCUMENTS

| | | |
|---|---|---|
| 2002/0001906 A1 | 1/2002 | Park |
| 2002/0168826 A1 | 11/2002 | Jin et al. |
| 2002/0179975 A1 | 12/2002 | Wakabayashi et al. |
| 2003/0052378 A1 | 3/2003 | Ohmi et al. |
| 2003/0057527 A1* | 3/2003 | Chung et al. ............... 257/642 |
| 2003/0096473 A1* | 5/2003 | Shih et al. .................. 438/240 |

FOREIGN PATENT DOCUMENTS

| | | |
|---|---|---|
| KR | 10-2001-0018819 | 3/2001 |
| KR | 010018819 | 3/2001 |
| KR | 2002-0001256 | 9/2002 |

OTHER PUBLICATIONS

"Electrical resistivity of pure metals", in *CRC Handbook of Chemistry and Physics, Internet Version 2005*, David R. Lide, ed., http://www.hbcpnetbase.com, CRC Press, Boca Raton, FL, 2005.*

English Translation of Korean Office Action for Application No. 10/2002-0019674 dated Apr. 21, 2004.

* cited by examiner

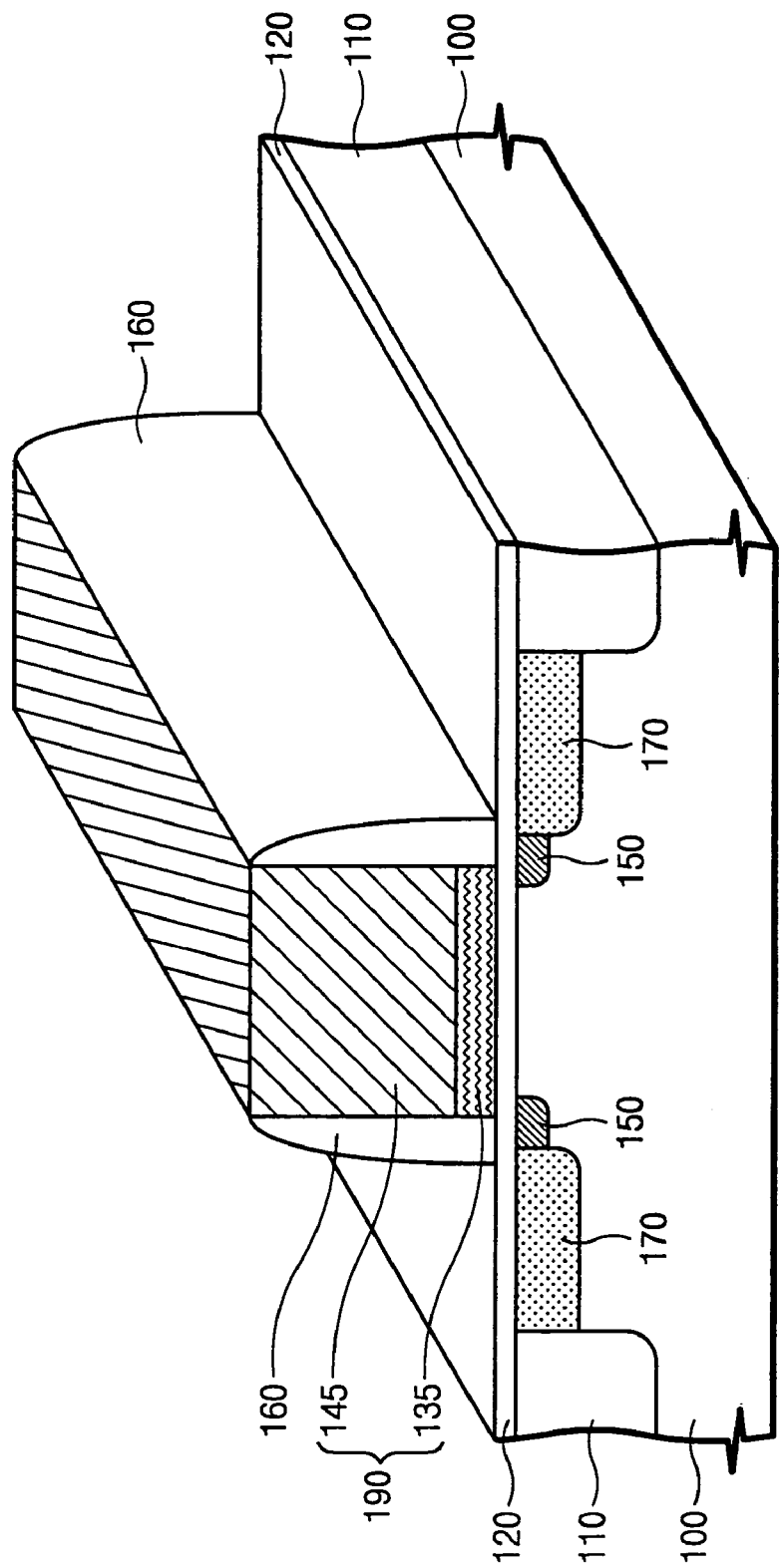

METHODS OF FORMING ELECTRONIC DEVICES INCLUDING HIGH-K DIELECTRIC LAYERS AND ELECTRODE BARRIER LAYERS

RELATED APPLICATIONS

This application is a divisional of and claims priority from U.S. application Ser. No. 10/411,949, filed Apr. 11, 2003 now abandoned, which claims the benefit of and priority from Korean Patent Application No. 2002-0019674, filed on Apr. 11, 2002. The disclosures of both of the above referenced applications are hereby incorporated herein by reference in their entirety.

FIELD OF THE INVENTION

The present invention generally relates to electronic devices, and more particularly to methods for forming electronic devices including high-k dielectric layers and related structures.

BACKGROUND OF THE INVENTION

A metal oxide semiconductor field effect transistor (MOSFET) includes a gate insulating layer and a gate electrode sequentially stacked on a semiconductor substrate. To achieve higher operating speeds and to save electric power, complimentary metal oxide semiconductor (CMOS) type devices include both NMOS and PMOS transistors. These CMOS-type semiconductor devices may use the same conductive material for gate electrodes for NMOS and PMOS transistors to reduce fabricating steps. The conductive material used for gate electrodes can be n-type polycrystalline silicon ("polysilicon") in general and the gate insulating layers are most commonly made of silicon oxide layers.

As semiconductor devices provide higher operating speeds, a thickness of the gate insulating layer may be reduced. If the thickness of the gate insulating layer is reduced to less than a critical thickness, leakage current may occur thereby degrading characteristics of the semiconductor devices. Recently, thicknesses of silicon oxide layers used as the gate insulating layers have approached this critical thickness. Thus, further reductions in thicknesses of silicon oxide layers used as gate insulating layers may be limited. Therefore, use of high-k dielectrics as gate insulating layers have been studied.

High-k dielectrics may provide improved characteristics with respect to reducing leakage currents even when an equivalent oxide thickness (EOT) is less than a critical thickness of a silicon oxide layer. The EOT of a high-k dielectric layer means the thickness of a silicon oxide layer that would provide the same capacitance. Thus, use of a high-k dielectric can provide a capacitance equivalent to that provided using a physically thinner silicon oxide layer while providing improved leakage current characteristics.

On the other hand, if a high-k dielectric is used as a gate insulating layer, the high-k dielectric may react with n-type polycrystalline silicon used as the gate electrode to form a silicon oxide layer. As a result, the silicon oxide layer formed through the reaction may increase a total EOT of the gate insulating layer. In addition, a work function of the materials of the gate electrode may have an effect on electrical characteristics of the transistor.

SUMMARY OF THE INVENTION

According to embodiments of the present invention, methods of forming a microelectronic device can include providing a gate dielectric layer, a gate electrode barrier layer, and a gate electrode metal layer. The gate dielectric layer can be provided on a channel region of a semiconductor substrate wherein the gate dielectric layer comprises a high-k dielectric material. The gate electrode barrier layer can be provided on the gate dielectric layer opposite the channel region of the semiconductor substrate, and the gate electrode metal layer can be provided on the gate electrode barrier layer opposite the channel region of the semiconductor substrate. In addition, the gate electrode barrier layer and the gate electrode metal layer can be layers of different materials. More particularly, the gate electrode metal layer may comprise a first material and the gate electrode barrier layer may comprise a second material, and the first material may have a lower electrical resistivity than the second material.

The high-k dielectric material may comprise at least one of tantalum oxide, titanium oxide, hafnium oxide, zirconium oxide, aluminum oxide, yttrium oxide, niobium oxide, cesium oxide, indium oxide, iridium oxide, $Ba_{1-x}Sr_xTiO_3$ (BST), and/or $Pb(Zr,Ti)O_3$ (PZT). In addition, the gate electrode barrier layer may comprise a material that is resistant to reaction with the high-k dielectric material, and/or a material having a work function in the range of approximately 3.9 eV to 4.4 eV. The gate electrode barrier layer, for example, may be a layer of tantalum nitride.

The gate electrode metal layer may comprise at least one of tungsten, tantalum, aluminum, titanium, copper, titanium silicide and/or cobalt silicide. Providing the gate dielectric layer may comprise forming the high-k dielectric material using at least one of chemical vapor deposition, metal organic chemical vapor deposition, and/or atomic layer deposition.

In addition, the gate electrode barrier layer and the gate dielectric layer may extend along sidewalls of the gate electrode metal layer away from a surface of the substrate. For example, a molding layer can be formed on the semiconductor substrate wherein the molding layer includes a hole therein exposing the channel region, and layers of the high-k dielectric material, electrode barrier material, and the electrode metal may be sequentially formed in the hole. After forming the layer of the electrode metal, the molding layer can then be removed to provide the gate structure. Removing the molding layer may include removing the molding layer using an etch that provides selectivity with respect to high-k dielectric material, the electrode barrier material, and the electrode metal. Moreover, removing the molding layer may include removing the molding layer using an isotropic etch.

Providing the gate dielectric layer, the gate electrode barrier layer, and the gate electrode metal layer can include forming layers of the high-k dielectric material, the electrode barrier material, and the electrode metal extending beyond the channel region. The gate electrode barrier and gate electrode metal layers can then be patterned using a single mask. In addition, the high-k dielectric material can be thermally treated prior to forming the electrode barrier material. The electrode barrier material can be formed using at least one of physical vapor deposition, sputtering, chemical vapor deposition, metal organic chemical vapor deposition, and/or atomic layer deposition. Moreover, the electrode barrier material can be formed using at least one of Tertbutylimino Tris (diethylamino) Tantalum (TBTDET), and/or polyethylene terephthalate (PET) as a precursor. The electrode barrier material can be formed using a tantalum compound as a precursor, wherein the tantalum compound can be at least one of $TaF_5$, $TaCl_5$, $TaBr_5$ and $TaI_5$. The electrode metal can be formed using at least one of physical vapor deposition, chemical vapor deposition, and/or silicidation.

According to additional embodiments of the present invention, a microelectronic device can include a gate dielectric layer, a gate electrode barrier layer, and a gate electrode metal layer. The gate dielectric layer is on a channel region of a semiconductor substrate, and the gate dielectric layer comprises a high-k dielectric material. The gate electrode barrier layer is on the gate dielectric layer opposite the channel region of the semiconductor substrate, and the gate electrode metal layer is on the gate electrode barrier layer opposite the channel region of the semiconductor substrate. The gate electrode barrier layer and the gate electrode metal layer may comprise different materials. Moreover, the gate electrode metal layer may comprise a first material and the gate electrode barrier layer may comprise a second material, and the first material may have a lower electrical resistivity than the second material.

The high-k dielectric material may comprises at least one of tantalum oxide, titanium oxide, hafnium oxide, zirconium oxide, aluminum oxide, yttrium oxide, niobium oxide, cesium oxide, indium oxide, iridium oxide, $Ba_{1-x}Sr_xTiO_3$ (BST), and/or $Pb(Zr,Ti)O_3$ (PZT). The gate electrode barrier layer may comprises a material that is resistant to reaction with the high-k dielectric material, and/or the gate electrode barrier layer may comprise a material having a work function in the range of approximately 3.9 eV to 4.4 eV. For example, the gate electrode barrier layer may comprise tantalum nitride. The gate electrode metal layer may comprise at least one of tungsten, tantalum, aluminum, titanium, copper, titanium silicide, and/or cobalt silicide. In addition, the gate electrode barrier layer and the gate dielectric layer may extend along sidewalls of the gate electrode metal layer away from a surface of the substrate.

According to still additional embodiments of the present invention, methods of forming an electronic device can include providing a dielectric layer wherein the dielectric layer comprises a high-k dielectric material, providing an electrode barrier layer on the dielectric layer, and providing an electrode metal layer on the electrode barrier layer opposite the dielectric layer. The electrode barrier layer and the electrode metal layer may comprise different materials. Moreover, the electrode metal layer may comprise a first material and the electrode barrier layer may comprise a second material, and the first material can have a lower electrical resistivity than the second material.

According to yet additional embodiments of the present invention, an electronic device can include a dielectric layer comprising a high-k dielectric material, an electrode barrier layer on the dielectric layer, and an electrode metal layer on the electrode barrier layer opposite the dielectric layer. The electrode barrier layer and the electrode metal layer may comprise different materials. Moreover, the electrode metal layer may comprises a first material and the electrode barrier layer may comprise a second material, and the first material may have a lower electrical resistivity than the second material.

BRIEF DESCRIPTION OF THE DRAWINGS

FIG. 3 is a perspective view illustrating a gate structure in accordance with first embodiments of the present invention.

DETAILED DESCRIPTION

Figure 1A:
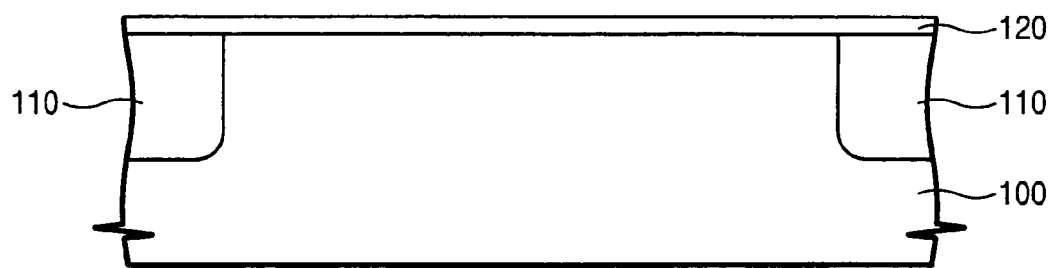
FIGS. 1A through 1D are cross-sectional views illustrating steps of forming a gate structure according to first embodiments of the present invention.

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, thicknesses of layers and regions are exaggerated for clarity. It will also be understood that when a layer is referred to as being "on" another layer or semiconductor substrate, it may be directly on the other layer or semiconductor substrate, or intervening layers may also be present. Like numbers refer to like elements throughout.

FIGS. 1A through 1D are cross-sectional views illustrating steps of fabricating gate structures in accordance with first embodiments of the present invention. Referring to FIG. 1A, isolating layers 110 are formed in predetermined areas of a semiconductor substrate 100. A high-k dielectric layer 120 is formed on an entire surface of the semiconductor substrate including the isolating layers 110. To provide a highly integrated semiconductor device, the isolating layers 110 can be formed using conventional trench isolation techniques. In this case, a thermal oxide layer and a silicon nitride liner may be formed between the isolating layers 110 to mask active regions of the semiconductor substrate 100 when forming the isolating layers. The thermal oxide layer and the silicon nitride liner are then removed.

The high-k dielectric layer 120 can be a gate insulating layer in a MOS transistor in accordance with embodiments of the present invention. To provide increased integration of semiconductor devices, insulating layers of materials having increased dielectric constants can be used. For this, a high-k dielectric layer 120 can include at least one material selected from the group consisting of tantalum oxide ($Ta_2O_5$), titanium oxide ($TiO_2$), hafnium oxide ($HfO_2$), zirconium oxide ($ZrO_2$), aluminum oxide ($Al_2O_3$), niobium oxide ($Nb_2O_5$), cesium oxide ($CeO_2$), yttrium oxide ($Y_2O_3$), indium oxide ($InO_3$), iridium oxide ($IrO_2$), $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, and/or $(Sr, Ca)RuO_3$. The high-k dielectric layer 120 may have a laminate structure including multiple thin layers of the above listed materials.

The high-k dielectric layer 120 can be formed using chemical vapor deposition (CVD). CVD techniques for forming the high-k dielectric may include atomic layer deposition (ALD) and/or metal organic chemical vapor deposition (MOCVD). High-k characteristics of the high-k dielectric layer 120 may result from strong ionic polarization. To get these characteristics, the high-k dielectric layer 120 may be relatively free of impurities, may be crystallized, and may have correct stoichiometry. The high-k dielectric layer 120 can be formed by MOCVD at a relatively low temperature (for example, from approximately 400° C. to 500° C.) to provide improved step coverage. When formed at the low temperature, however, the high-k dielectric layer 120 may not provide all three desired characteristics of purity, crystallinity and stoichiometry. Thus, a thermal process may be applied to the high-k dielectric layer 120 formed at low temperature to provide desired capacitance and leakage current characteristic.

A thermal process may accomplish three functions. First, the thermal process may take impurities away from the deposited layers. For example, a thermal process may release a methane ($CH_4$) gas and/or water vapor ($H_2O$) at approximately 600° C. Similarly, the thermal process may release carbon dioxide ($CO_2$) at approximately 900° C., due to a decomposition of metal carbonate impurities in a BST layer. This phenomenon may be confirmed by thermal desorption spectroscopy. A concentration of the layer may increase as the impurities are removed, so that a capacitance of the thermally processed layer increases and the leakage current of the layer decreases.

Second, a thermal process may balance a stoichiometry of the layer for improved electrical characteristics. For example, a tantalum oxide layer may lack oxygen immediately after having been stacked, but a stoichiometry of the tantalum oxide layer may be improved by thermal treatment in an oxidizing ambient. Third, the thermal process may crystallize the high-k dielectric layer 120. The layer deposited at a low temperature may be in an amorphous phase, and the layer may have no requisite microstructure to yield desired electrical characteristics. Temperatures of approximately 800° C. may be required to crystallize a tantalum oxide layer, and temperatures of approximately 700° C. may be required to crystallize BST.

When the heating time of the high-k dielectric layer 120 is past, oxygen atoms may penetrate the dielectric layer 120 and react with the semiconductor substrate 100, so that a silicon oxide layer may be formed between the high-k dielectric layer 120 and the semiconductor substrate 100. The silicon oxide layer may reduce the capacitance of the gate insulating layer. Thus, precise control of the thermal process may be desired. To reduce any problems, the thermal process can be carried out using a rapid thermal process.

Figure 1B:
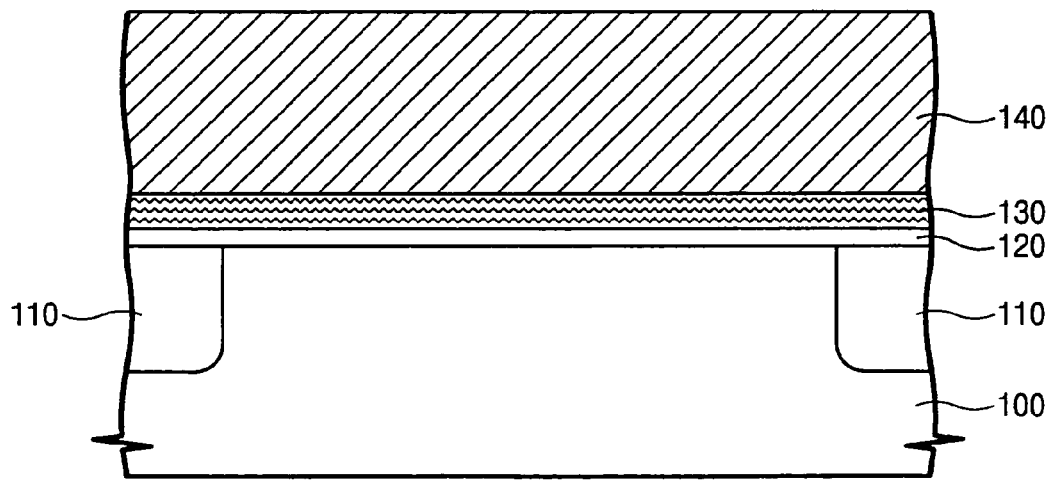

Referring to FIG. 1B, a barrier metal layer 130 and a gate metal layer 140 can be sequentially formed on the high-k dielectric layer 120. The barrier metal layer 130 can be a conductive layer having reaction resistance to the high-k dielectric layer 120. In particular, the barrier metal layer 130 can be a layer of a conductive material having good oxidation resistance to control an oxidation which may increase an equivalent oxide thickness (EOT). In addition, the barrier metal layer 130 may comprise one or more materials having a work function similar to that of n-type polysilicon. Thus, the barrier metal layer 130 may be a layer of tantalum nitride (TaN) providing good oxidation resistance and a work function of approximately 4.2 eV to 4.4 eV. Alternatively, or in addition, the barrier metal layer 130 may be a layer of tungsten nitride (WN) and/or titanium nitride (TiN).

The barrier metal layer 130 can be formed using chemical vapor deposition (CVD). CVD techniques used to form the barrier metal layer 130 may include atomic layer deposition (ALD), plasma enhanced atomic layer deposition (PEALD), and/or metal organic chemical vapor deposition (MOCVD). When the tantalum nitride is formed by CVD, the CVD can be carried out at a temperature of approximately 260° C., at a pressure of approximately 1 torr, in a plasma at a power of approximately 100 W, and/or with at least one of Tert-butylimino Tris (diethylamino) Tantalum (TBTDET), and/or polyethylene terephthalate (PEP) used as a precursor. The high-k dielectric layer 120 and the barrier metal layer 130 can be made of materials providing etch selectivity with respect to each other for a convenience in successively forming a gate pattern.

The barrier metal layer 130 may not be sufficient for the gate electrode to satisfy general needs for high speed semiconductor devices even though the barrier metal layer 130 is conductive. A concentration of carbon (C) may further increase when a metal organic precursor is used to form the barrier metal layer 130, and carbon may induce an increase of resistivity. For a high speed semiconductor device, the resistivity may need to be reduced, and the gate metal layer 140 can be made of metals with low specific resistance. Preferably, the gate metal layer 140 can be a layer of at least one material selected from the group consisting of tungsten (W), tantalum (Ta), titanium (Ti), aluminum (Al), copper (Cu), titanium silicide ($TiSi_x$), and/or cobalt silicide ($CoSi_x$). The gate metal layer 140 may also be formed using physical vapor deposition (PVD), chemical vapor deposition (CVD), and/or silicidation.

Figure 1C:
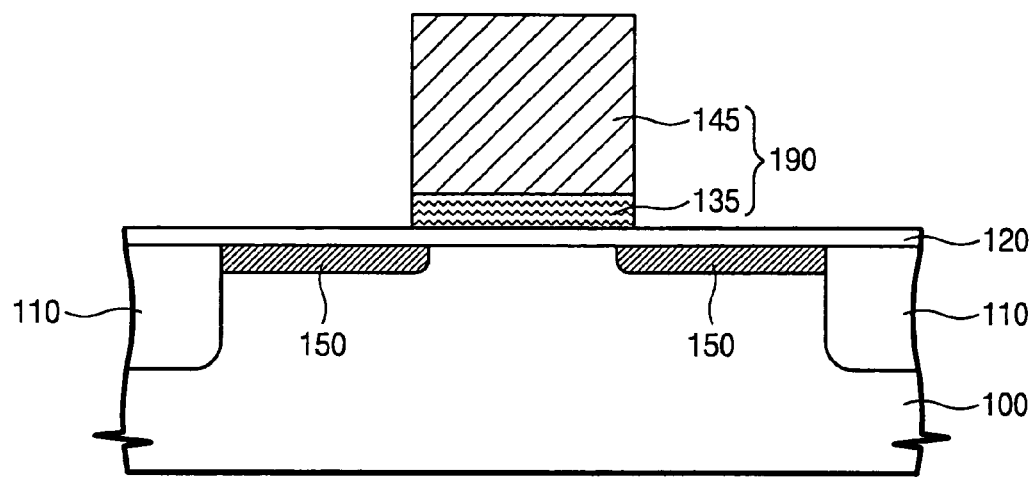

Referring to FIG. 1C, the gate metal layer 140 and the barrier metal layer 130 are sequentially patterned to form a gate metal pattern 145 and a barrier metal pattern 135. The barrier metal pattern 135 and the gate metal pattern 145 are sequentially stacked to provide a gate pattern 190. The gate pattern 190 may cross portions of isolating layers, and the gate pattern 190 may expose portions of the high-k dielectric layer 120.

The gate pattern 190 can be etched using an anisotropic etch with a photoresist pattern as an etching mask. In this case, the high-k dielectric layer 120 remaining around the gate pattern 190 may be used as a buffer layer to reduce ion channeling in a successive implant process used to form low-concentration impurity regions. The semiconductor substrate around the gate pattern 190 is a region where source/drain affecting electrical characteristics of a semiconductor substrate may be formed by the ion implant. Therefore, the etching process can be performed to reduce damage to the semiconductor substrate 100. For this, the etch used to form the gate pattern 190 can be performed with an etch recipe providing etch selectivity with respect to the high-k dielectric layer 120. By implanting a relatively low-concentration of ions using the gate pattern 190 as an ion implantation mask, a lightly doped region 150 can be formed in the semiconductor substrate 100 around the gate pattern 190.

Figure 1D:
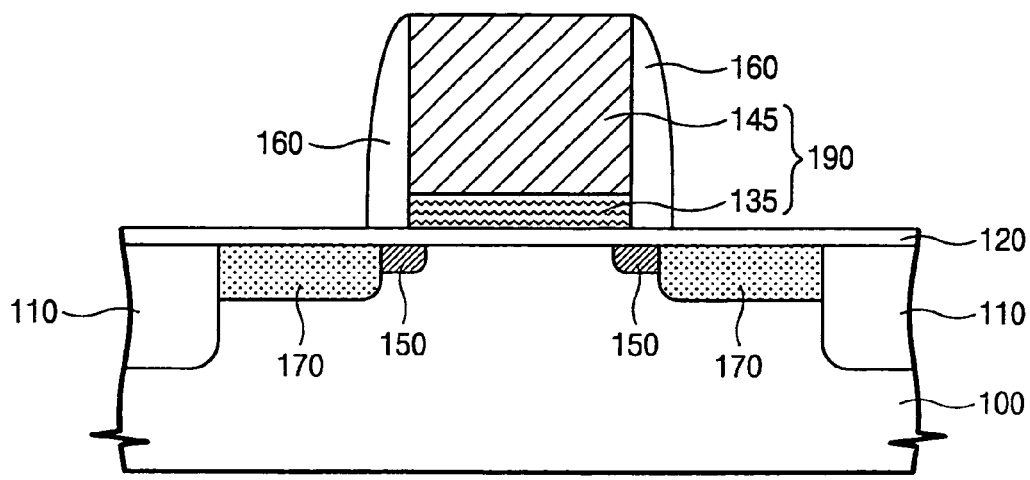

Referring to FIG. 1D, gate spacers 160 can be formed on both sidewalls of the gate pattern 190. By implanting a relatively high-concentration of impurity ions using the gate spacer 160 as a mask, a heavily doped region 170 can be formed in the semiconductor substrate 100. The step of forming the gate spacers 160 may include forming a spacer insulating layer (not shown) on the entire surface of the semiconductor substrate (after forming the lightly doped region 150), and anisotropically etching the spacer insulating layer. The anisotropic etch used to form the gate spacer 160 can be performed with an etch recipe providing etch selectivity with respect to the high-k dielectric layer 120. A thermal process can be performed to activate the doped impurities after implantation thereof, and the thermal process can be a rapid thermal process.

Figure 2A:
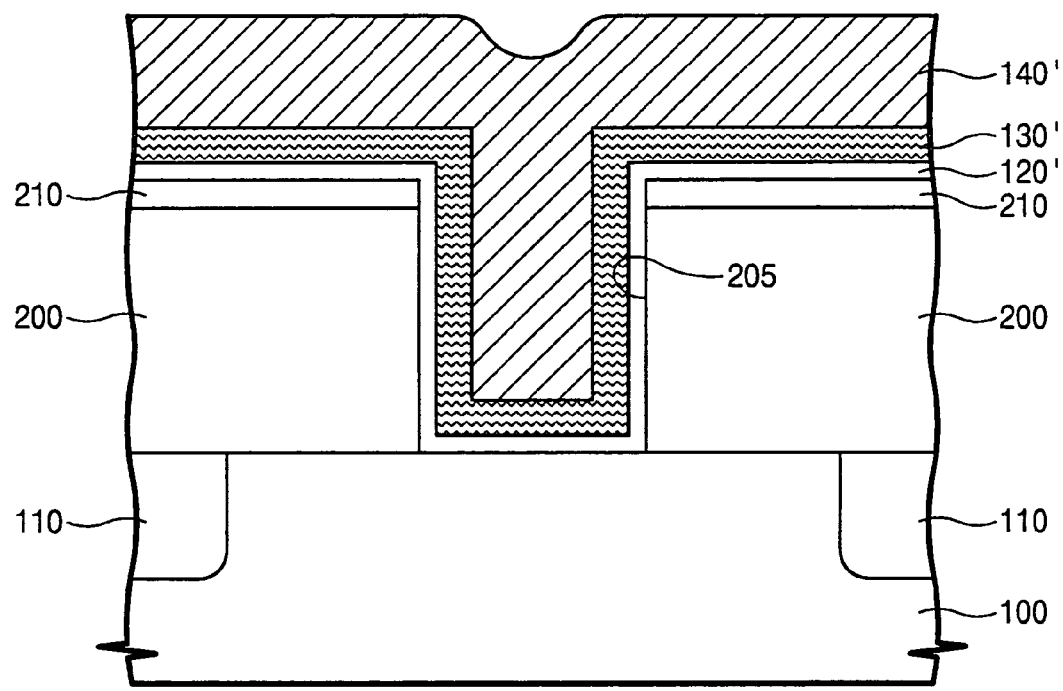
FIGS. 2A through 2C are cross-sectional views illustrating steps of forming a gate structure according to second embodiment of the present invention.
Figure 2B:
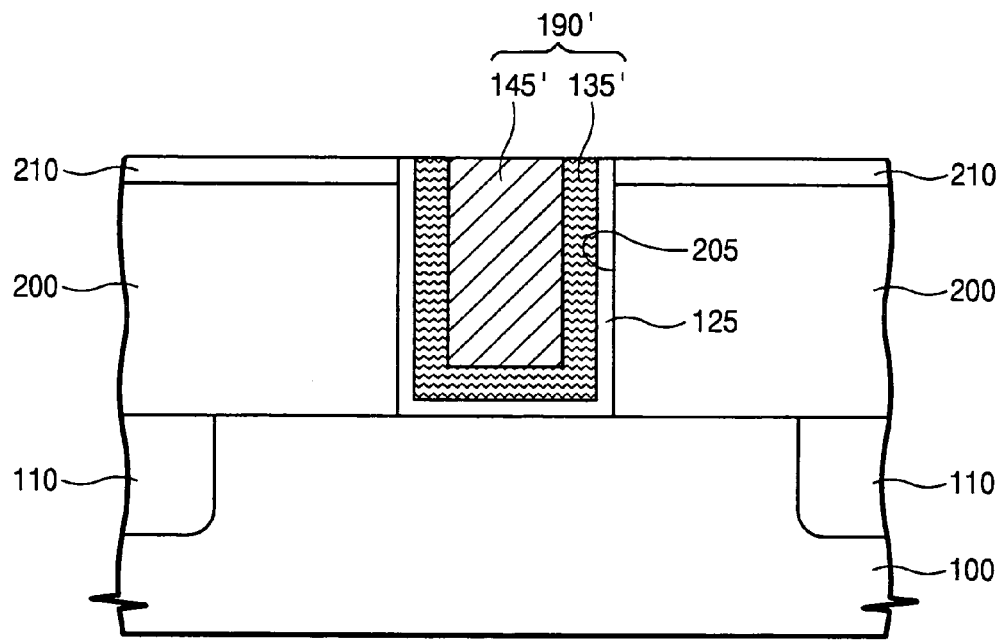
Figure 2C:
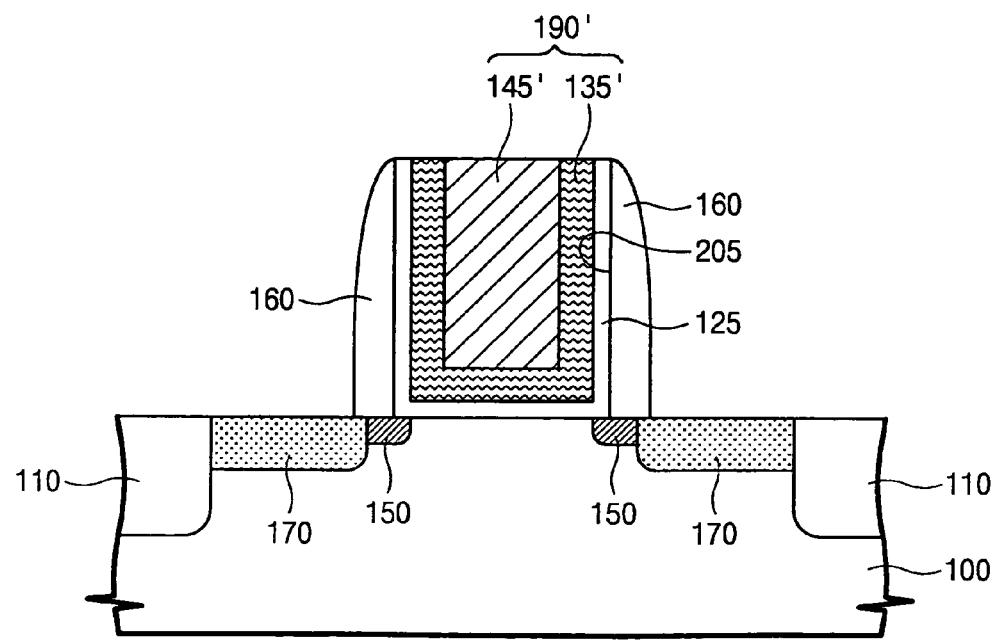

FIGS. 2A through 2C are cross-sectional views showing steps of forming a gate structure in accordance with second embodiments of the present invention. Second embodiments of the present invention are different from the first embodiments discussed above in terms of forming a gate pattern using a damascene process. In both embodiments, similar layers are marked with similar reference numbers, and steps of forming similar layers are the same as discussed above with respect to FIGS. 1A through 1D. Therefore the repeated explanation is omitted where appropriate.

Referring to FIG. 2A, at a predetermined region on the semiconductor substrate 100, isolating layers 110 can be formed to define active regions. A molding layer can be formed on the entire surface of the semiconductor substrate including the isolating layers 110 and then patterned to provide molding pattern 200. The molding pattern 200 may cross the isolating layers 110 and may have an opening 205 exposing a top surface portion of the semiconductor substrate 100. When the gate pattern is formed using the damascene process, the molding pattern 200 serves as a mold to define the gate pattern. Thereafter, a high-k dielectric layer 120', a barrier metal layer 130', and a gate metal layer 140' are sequentially formed on the entire surface of the semiconductor substrate including the molding pattern 200.

Patterning to form the molding pattern 200 can be performed using an anisotropic etch with an etch recipe that provides etch selectivity with respect to the semiconductor substrate 100. For this, the molding layer can be made of materials providing etch selectivity with respect to the semiconductor substrate 100. To reduce damage to the gate pattern during a successive removal of the molding pattern, the molding layer can be made of materials providing etch selectivity with respect to the high-k dielectric layer 120', the barrier metal layer 130', and the gate metal layer 140', respectively. The molding layer can be made of one or more materials selected from silicon oxide, silicon nitride, and/or silicon-oxy-nitride.

During a photolithography process used to form the molding pattern 200, an anti-reflecting layer 210 may be formed on the molding layer opposite the substrate prior to patterning. The anti-reflecting layer 210 can be a layer of silicon-oxy-nitride(SiON). Therefore, the anti-reflecting layer 210 may not be needed when the molding layer is a layer of silicon oxide.

Materials used for the high-k dielectric layer 120', the barrier metal layer 130', and the gate metal layer 140' can be the same as those discussed above with respect to FIG. 1A. As to processes for forming these layers, each of these layers can be formed using one or more selected from ALD, PEALD, and/or MOCVD as discussed above with respect to FIG. 1A.

A width of a gate pattern in the semiconductor device may become narrow as the integration of semiconductor devices increases. Thus, the aspect ratio of opening 205 defining the gate pattern may increase. In addition, uniform deposition of the deposited high-k dielectric layer 120' and the barrier metal layer 130' may become more difficult as an aspect ratio of the opening 205 increases. An entrance of the opening 205 may become too narrow if the barrier metal layer 130' provides insufficient step coverage. Accordingly, the high-k dielectric layer 120' and the barrier metal layer 130' may be formed to provide improved step coverage. The high-k dielectric layer 120' can be formed to provide uniform thickness because the high-k dielectric layer 120' is used as a gate insulating layer. ALD and/or PECVD can be used to deposit the high-k dielectric layer 120' and the barrier metal layer 130' to provide good step coverage and uniform thickness.

As explained with respect to FIG. 1A, the gate metal layer 140' can include a layer of one or more metals having low resistivity. In addition, the opening 205 covered with the barrier metal layer 130' may have a relatively large aspect ratio. Thus, the gate metal layer 140' can be formed using a technique providing good gap fill characteristics. Meanwhile, copper can be used as the gate metal layer 140' using the damascene process. When using copper as the gate metal layer 140', the copper layer can be formed using an electroplating technique.

Referring to FIG. 2B, the gate metal layer 140', the barrier metal layer 130', and the high-k dielectric layer 120' can be planarly etched in succession to expose the top surface of the anti-reflecting layer 210. Thus, a high-k dielectric pattern 125, a barrier metal pattern 135', and a gate metal pattern 145' may provide a gate pattern 190' and fill the opening 205.

As illustrated in the cross-sectional view, the high-k dielectric pattern 125 and the barrier metal pattern 135' may be U shaped and the gate metal pattern 145' may be square in shape. The bottom surface of the high-k dielectric pattern 125 adjacent the substrate 100 may serve as the gate insulating layer. The high-k dielectric pattern 125, the barrier metal pattern 135', and the gate metal pattern 145' may also cross portions of the isolating layers 110. The planarizing etch process can be performed using chemical mechanical polishing (CMP).

Referring to FIG. 2C, the anti-reflecting layer 210 and the molding pattern 200 can be removed to expose portions of the semiconductor substrate 100 next to the gate pattern 190'. The removing step can be carried out using an isotropic etch with a etch recipe providing etch selectivity with respect to the semiconductor substrate 100, the high-k dielectric pattern 125, the barrier metal pattern 135', and the gate metal pattern 145'.

Thereafter, an ion implant using the gate pattern 190' as an ion implant mask can be performed to provide lightly doped regions 150 in exposed portions of semiconductor substrate 100 at both sides of the gate pattern 190'. The ion implant used to form the lightly doped regions may be carried out after forming a photoresist pattern, which covers a predetermined region of the semiconductor substrate (e.g., PMOS transistor region at a peripheral circuit region).

After forming the lightly doped regions, a gate spacer 160 can be formed on both sidewalls of the gate pattern 190'. An ion implant using the gate spacer 160 and the gate pattern 190' as an ion implant mask can be carried out to form a heavily doped region 170 in exposed portions of semiconductor substrate 100 adjacent to the gate spacers 160. A thermal process can be performed to activate the impurities.

While the impurity concentration of the heavily doped region 170 is higher than that of the lightly doped region 150, both of the doped regions 150 and 170 may have the same conductivity type. In addition, the lightly doped region 150 is interposed between the channel region under the gate pattern 190' and the heavily doped region 170. Thus, the heavily doped region 170 and the lightly doped region 150 provide a lightly doped drain (LDD) structure.

Ion implants for forming the heavily doped region 170 and the lightly doped region 150 can be carried out on exposed portions of semiconductor substrate 100. To reduce ion channeling, a buffer layer covering the exposed portions of semiconductor substrate 100 may be provided and/or an incline ion-implantation technique may be applied.

The high k dielectric pattern 125 covers both sidewalls of the barrier metal pattern 135' used as the gate electrode. Therefore, a reduction of channel length caused by the impurity diffusion may be reduced as a result of the width of the high-k dielectric pattern 125.

Figure 4:
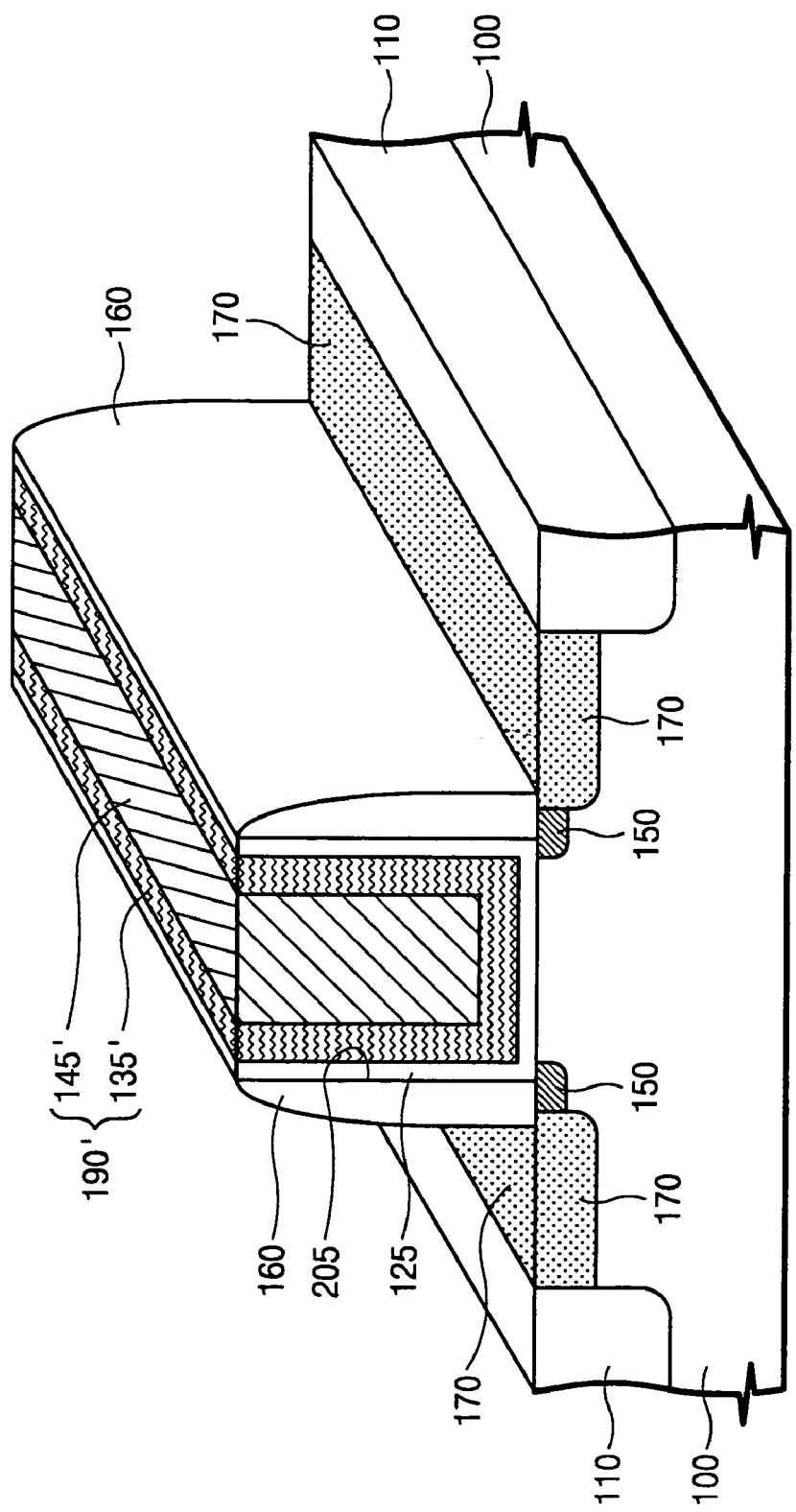
FIG. 4 is a perspective view illustrating a gate structure in accordance with second embodiments of the present invention.

FIG. 3 is a cross-sectional view illustrating a gate structure in accordance with first embodiments discussed with respect to FIGS. 1A through 1D. FIG. 4 is a cross-sectional view illustrating a gate structure in accordance with second embodiments discussed with respect to FIGS. 2A through 2C.

Referring to FIGS. 3 and 4, isolating layers 110 are disposed at predetermined regions of the semiconductor substrate 100 to define one or more active regions therebetween. The gate patterns 190 and 190', which may cross portions of the isolating layers, are disposed on the respective active regions. The gate spacers 160 are disposed on sidewalls of the gate patterns 190 and 190'. The gate patterns 190 and 190' comprise the sequentially stacked barrier metal patterns 135 and 135' and gate metal patterns 145 and 145'.

A lightly doped region 150 is disposed at the surface of substrate 100 adjacent the gate patterns 190 and 190'. A heavily doped region 170 is disposed at the surface of the semiconductor substrate 100 next to the gate spacers 160. The heavily doped region 170 and the lightly doped region 150 may have the same conductivity-type that is the opposite of the conductivity type of the semiconductor substrate 100. In addition, the heavily doped regions 170 may have higher concentration and deeper depth than the lightly doped regions 150. Therefore, the heavily doped regions 170 and the lightly doped regions 150 may provide an LDD structure and may serve as MOSFET source/drain regions.

A gate insulating layer is disposed between the gate patterns 190 and 190' and the semiconductor substrate 100. The gate insulating layer comprises a material having a relatively high dielectric constant. Referring to first embodiments illustrated in FIG. 3, a high-k dielectric layer 120 intervenes between the gate spacers 160 and the semiconductor substrate 100. In this case, the high-k dielectric layer 120 may extend over the active region. Referring to second embodiments illustrated in FIG. 4, a high-k dielectric pattern 125 is interposed between the gate spacers 160 and the gate pattern 190'. In each embodiment, the high-k dielectric layer 120 and the high-k dielectric pattern 125 may serve as gate insulating layers of respective MOS transistors.

The high-k dielectric layer 120 and the high-k dielectric pattern 125 may each comprise at least one material selected from the group consisting of tantalum oxide ($Ta_2O_5$), titanium oxide ($TiO_2$), hafnium oxide ($HfO_2$), zirconium oxide ($ZrO_2$), aluminum oxide ($Al_2O_3$), niobium oxide ($Nb_2O_5$), cesium oxide ($CeO_2$), yttrium oxide ($Y_2O_3$), indium oxide ($InO_3$), iridium oxide ($IrO_2$), $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, and/or $(Sr, Ca)RuO_3$. The high-k dielectric layer 120 may have a laminate structure as discussed with respect to in FIG. 1A.

The barrier metal patterns 135 and 135' can be provided to reduce reactions between the high-k dielectric layer 120 and the gate metal layer 145 or between the high-k dielectric pattern 125 and the gate metal layer 145', respectively. Thus, the barrier metal patterns 135 and 135' can be layers of materials having good reaction resistance with respect to the high-k dielectric layer 120 and the high-k dielectric pattern 125. Each barrier metal pattern 135 and 135' can be a layer of at least one material selected from tantalum nitride, tungsten nitride, and/or titanium nitride, which may provide good reaction resistance with respect to the high-k dielectric layer. Furthermore, the barrier metal patterns 135 and 135' used as gate electrodes can be layers of materials having a work function similar to that of n-type polysilicon which is widely used as the gate electrode of CMOS transistors. The work function of the gate electrode may be an important process parameter used to define impurity concentrations of the channel regions under the gate patterns 190 and 190', the heavily doped regions 170, and the lightly doped regions 150. Thus, if the work function of the gate electrode is much different than the work function of the conventional gate electrode, additional study may be needed to obtain improved characteristics of the transistor. Considering this, the barrier metal patterns 135 and 135' can be layers of tantalum nitride having work function of approximately 4.2 eV to 4.4 eV.

As previously mentioned, the gate metal patterns 145 and 145' may comprise a metal having low resistivity to provide high speed operation. The gate metal patterns 145 and 145' may comprise at least one material selected from the group consisting of tungsten, tantalum, titanium, aluminum, copper, titanium silicide, and/or cobalt silicide. Without the barrier metal patterns 130 and 130', metal materials of the gate electrode may react with the high-k dielectric layers 120 and 125 to form metal oxide. However, embodiments of the present invention may reduce formation of metal oxide as a result of the barrier metal patterns 130 and 130'. In addition, as shown in FIG. 4, the barrier metal pattern 135' may have a U-shaped cross-section to cover a bottom and both sidewalls of the gate pattern 145'.

According to embodiments of the present invention, a high-k dielectric material is used for the gate insulating layer, and a barrier metal pattern and a gate metal pattern are sequentially stacked to provide the gate electrode. Using the high-k dielectric as the gate insulating layer, the gate insulating layer may provide a thin equivalent oxide thickness and a characteristic of decreased leakage current. According to embodiments of the present invention, the barrier metal pattern comprises materials providing good reaction resistance with respect to the high-k dielectric. Therefore, reaction between the gate metal pattern and the high-k dielectric can be reduced, so that a thin equivalent oxide thickness can be maintained. In addition, the gate metal pattern may comprise materials having low resistivity. Thus, a total resistivity of the gate electrode can be reduced. As a result, high-speed semiconductor devices may be fabricated, wherein a gate insulating layer has a relatively thin equivalent oxide thickness and a gate electrode has a relatively low resistivity. Also according to embodiments of the present invention, the barrier metal pattern can be formed of tantalum nitride which has a work function similar to that' of n-type polysilicon used as a gate electrode.

Embodiments of the present invention may thus provide methods of forming gate structures that reduce an equivalent oxide thickness (EOT) in a gate insulating layer. Embodiments of the present invention may provide methods of forming gate structures with gate electrodes having improved reaction resistance and/or conductivity. Embodiments of the present invention may also provide gate structures comprising gate insulating layers with thin equivalent oxide thicknesses (EOT) and gate electrodes with low resistivity.

Embodiments of the present invention may be achieved by forming a high-k dielectric layer and multiple metal layers. For example, a high-k dielectric, a barrier metal layer, and a gate metal layer can be formed on a semiconductor substrate and then the gate metal layer and the barrier metal layer can be patterned to form a barrier metal pattern and a gate metal pattern. In this case, the barrier metal pattern and the gate metal pattern may comprise a gate electrode. The high-k dielectric may comprise at least one material selected from tantalum oxide, titanium oxide, hafnium oxide, zirconium oxide, aluminum oxide, yttrium oxide, niobium oxide, cesium oxide, indium oxide, iridium oxide, BST and/or PZT.

The high-k dielectric layer can be formed by a chemical vapor deposition (CVD) process such as metal organic chemical vapor deposition (MOCVD) and/or atomic layer deposition (ALD). Alternatively, a physical vapor deposition (PVD) process, such as sputtering, may be used instead of or in addition to CVD. Before the barrier metal layer is formed, a thermal process may be applied to the semiconductor substrate and the high-k dielectric.

The barrier metal layer may comprise one or more materials providing reaction resistance to the high-k dielectric, and can be made of one or more materials having a work function of approximately 3.9 eV to 4.4 eV. For example, the barrier metal layer can be formed of tantalum nitride.

The barrier metal layer can be formed using a CVD process such as MOCVD and/or ALD. In addition, a CVD process for forming the barrier metal layer may use TBT-DET (Tert-butylimino Tris (diethylamino) Tantalum), and/or PET (polyethylene terephthalate) as a precursor. Alternatively, a CVD for forming the barrier metal layer may use a tantalum compound such as $TaF_5$, $TaCl_5$, $TaBr_5$, and/or $TaI_5$ as a precursor.

The gate metal layer can be made of one or more materials having a relatively low resistivity, such as tungsten, tantalum, titanium, aluminum, copper, titanium silicide, and/or cobalt silicide. Moreover, the gate metal layer can be formed by physical vapor deposition (PVD), chemical vapor deposition (CVD), and/or silicidation.

In addition, a molding pattern including an opening therein may be formed before the high-k dielectric is formed. The opening of the molding pattern may expose the upper surface of the semiconductor substrate where the gate electrode will be formed. Patterning the barrier metal layer and the gate metal layer may include forming the high-k dielectric, barrier metal pattern, and the gate metal pattern in the opening and removing the molding pattern. Prior to removing the molding pattern, portions of the gate metal layer, the barrier metal layer, and the high-k dielectric on a surface of the molding pattern opposite the substrate can be planarly etched in succession until the surface of the molding pattern is exposed. Removing the molding pattern can be performed using an isotropic etch with an etch recipe providing an etch selectivity with respect to the barrier metal layer, the gate metal pattern, and the high-k dielectric material.

According to additional embodiments of the present invention, a gate structure may include multiple metal layers providing both reaction resistance with respect to the high-k dielectric material and a low resistivity. The gate structure may include a high-k dielectric, a barrier metal pattern, and a gate metal pattern, which are sequentially stacked on the semiconductor substrate.

In this case, the high-k dielectric material can be selected from at least one of tantalum oxide, titanium oxide, hafnium oxide, zirconium oxide, aluminum oxide, yttrium oxide, niobium, oxide, cesium oxide, indium oxide, iridium oxide, BST, and/or PZT. The barrier metal pattern can be made of one or more materials providing reaction resistance with respect to the high-k dielectric and a work function in the range of approximately 3.9 eV to 4.4 eV. For example, the material of the barrier metal pattern can be tantalum nitride. In addition, the gate metal pattern can be made of at least one material selected from the group consisting of tungsten, tantalum, titanium, aluminum, copper, titanium silicide, and/or cobalt silicide. In addition, the barrier metal pattern may have a U-shaped cross-section to cover a bottom and sidewalls of the gate metal pattern.

Embodiments of the present invention may comprise a gate structure including a high-k dielectric gate insulating layer, a barrier metal pattern, and a gate metal pattern. In this case, the barrier metal pattern can be made of tantalum nitride which provides relatively good reaction resistance to the high-k dielectric, and the gate metal pattern can be made of one or more materials having the low specific resistance such as a material selected from the group consisting of tungsten, tantalum, titanium, aluminum, copper, titanium silicide, and/or cobalt silicide. A method of forming the gate structure can include sequentially forming a barrier metal layer and a gate metal layer on a semiconductor substrate. The gate metal layer and the barrier metal layer can then be patterned to form the barrier metal pattern and the gate metal pattern. The barrier metal layer can be formed of tantalum nitride and the gate metal layer can be formed of one or more materials having low specific resistance.

It should be noted that many variations and modifications might be made to the embodiments described above without substantially departing from the principles of the present invention. All such variations and modifications are intended to be included herein within the scope of the present invention, as set forth in the following claims.

The invention claimed is:

1. A method of forming a microelectronic device, the method comprising:
   forming a mold layer on a semiconductor substrate wherein the mold layer includes a hole therein exposing a channel region of the semiconductor substrate;
   after forming the mold layer, forming a gate dielectric layer on sidewalls of the hole and on the channel region of the semiconductor substrate wherein the gate dielectric layer comprises a high-k dielectric material;
   forming a gate electrode barrier layer on the gate dielectric layer opposite the channel region and opposite sidewalls of the hole;
   forming a gate electrode metal layer on the gate electrode barrier layer opposite the channel region and opposite sidewalls of the hole; and
   after forming the gate electrode metal layer, removing the mold layer.

2. A method according to claim 1 wherein the gate electrode barrier layer and the gate electrode metal layer comprise different materials.

3. A method according to claim 1 wherein the high-k dielectric material comprises a high-k metal-oxide dielectric material.

4. A method according to claim 3 wherein the high-k metal-oxide dielectric material comprises at least one of tantalum oxide, titanium oxide, hafnium oxide, zirconium oxide, aluminum oxide, yttrium oxide, niobium oxide, cesium oxide, indium oxide, iridium oxide, $Ba_{1-x}Sr_xTiO_3$ (BST), and/or $Pb(Zr,Ti)O_3$ (PZT).

5. A method according to claim 1 wherein the gate electrode barrier layer comprises a material having a work function in the range of approximately 3.9eV to 4.4eV.

6. A method according to claim 1 wherein the gate electrode barrier layer comprises tantalum nitride.

7. A method according to claim 1 wherein the gate electrode metal layer comprises at least one of tungsten, tantalum, aluminum, titanium, copper, titanium silicide, cobalt silicide, and/or alloys thereof.

* * * * *